United States Patent [19]
Jones, Jr. et al.

[11] Patent Number: 5,530,762
[45] Date of Patent: Jun. 25, 1996

[54] REAL-TIME DIGITAL AUDIO REVERBERATION SYSTEM

[75] Inventors: Ronald H. Jones, Jr., Delray Beach; Bruce D. Jobse, Boca Raton, both of Fla.

[73] Assignee: International Business Machines Corporation, Armonk, N.Y.

[21] Appl. No.: 251,461

[22] Filed: May 31, 1994

[51] Int. Cl.$^6$ ............................................. H03G 3/00
[52] U.S. Cl. ................... 381/63; 381/51; 381/61
[58] Field of Search .................... 381/63, 51, 61

[56] References Cited

U.S. PATENT DOCUMENTS

| | | | |
|---|---|---|---|
| 3,992,582 | 11/1976 | Osakabe | 381/63 |
| 4,352,954 | 10/1982 | Franssen | 381/63 |
| 5,369,710 | 11/1994 | Asai | 381/63 |

OTHER PUBLICATIONS

"Musical Applications of Microprocessors", Chamberlin, 1980, pp. 460–464.

Primary Examiner—Curtis Kuntz
Assistant Examiner—Minsun Oh
Attorney, Agent, or Firm—Bookstein & Kudirka; Bruce D. Jobse

[57] ABSTRACT

A software reverberator system produces a sequence of "reverberated" samples from an input digital word sequence where each word in the input sequence comprises a digitized sample of an original analog audio signal. The invention generates the reverberated samples by adding together several scaled and delayed input words to produce a corresponding reverberated output word. The resulting reverberated output word stream can be converted to analog form in sequence to produce a reverberated version of the original audio signal. The delays are produced by clocking the input words through multi-stage first-in, first-out buffers with a number of stages selected to give the desired delay.

20 Claims, 5 Drawing Sheets

REAL-TIME DIGITAL AUDIO REVERBERATION SYSTEM

FIELD OF THE INVENTION

This invention relates generally to digital audio signals and more specifically to the addition of reverberation to digital audio signals.

BACKGROUND OF THE INVENTION

The past decade has seen a revolution in computing. The advent and proliferation of personal computers has transformed the computing environment from one of climate-controlled computer rooms with technician acolytes to note-book computers and pen-based personal communicators that users carry wherever they go. A significant expansion of computing applications is a concomitant result of this changing computer environment. In the past, computers provided, primarily, accounting, data reduction, and data-base management applications. They now, additionally, provide a variety of voice-messaging and multimedia applications.

Multimedia applications are, generally, those applications that provide combined video and audio output. They include business presentations, communications packages, and entertainment applications. These applications, particularly the entertainment applications (e.g., games, music, videos etc.), require reasonably high quality audio output. Whether it is the roar of a Tyrannosaurus Rex emanating from a Jurassic Park™ CD-ROM-game or the subtle intonations of one's favorite Verdi aria reproduced for a multi-media CD-ROM encyclopedia tour of "La Scala", sound reproduction plays a crucial role in the effectiveness of a multi-media presentation. But, even if one provides otherwise perfect sound reproduction, there are "sound effects", created by the listening environment, which impart a distinctive character to the sound a listener hears and these effects, or the absence of them, may have a subtle, but profound, effect on a listener's perception of the reproduced sound.

One of the commonly recognized sound effects is that of reverberation. Reverberation is the result of sound traveling different paths to reach a listener's ear. Sound travelling along a direct path will reach the ear first, that which is reflected once before it reaches the ear may reach it next, that which is reflected twice may reach it next, etc. The reverberation characteristics of a dinosaur-filled jungle would differ considerably from those of a concert hall and, to improve users' listening experiences, it is highly desirable to provide a reverberation capability for multimedia systems. Reverberation, if subject to the control of a listener, could be tailored, at the listener's command, to emulate the "full" sound of a concert hall, or the "dead" sound of a field of new-fallen snow.

Although listener-controlled reverberation effects are commercially available on some high-fidelity sound systems and professional audio signal processing devices, these systems generally employ either specialized hardware such as delay lines, multipliers, and adders or digital signal processor chips (DSPs) to produce and combine the multi-ply-delayed versions of an audio signal necessary to achieve the reverberation effect. Although one could use either of these approaches to produce reverberation effects for a multi-media system, multi-media applications, especially personal-computer-based multi-media applications for home use, are highly cost-sensitive. The additional expense of specialized hardware, whether it is based on DSPs or discrete delay lines and adders, may be prohibitive for an inexpensive personal-computer based system. Additionally, personal computer expansion slots are frequently in short supply and an additional expansion slot may not be available for sound-processing hardware. For these reasons it would be highly desirable to provide reverberation sound effects for personal-computer-based multi-media systems without the requirement for additional equipment.

SUMMARY OF THE INVENTION

The forgoing problems are addressed in an illustrative embodiment of the invention in which a computer-based system produces a sequence of "reverberated" samples from a sequence of digital audio samples. The invention retrieves each input sample and produces a corresponding output sample, each output sample comprising the sum of several input samples received at different times and an output sample derived at a previous time.

More specifically, the invention uses the computer's microprocessor and random access memory (RAM) to delay each input sample for first and second delay periods, and to invert (i.e. change the sign of) the sample. Further, the inventive system delays, for a third delay period, a previously output, reverberated sample. During each sample interval the system multiplies the input sample, a delayed input sample, and the delayed output sample by predetermined coefficients. Next, the system sums these products with another delayed input sample to produce a current, reverberated output sample.

In an alternative embodiment, the inventive system also sums an undelayed, multiplied input sample to the reverberator output to produce the system output.

Thus, no expansion card, DSP chip, or additional hardware is required. The coefficients of the delayed signals and the delay lengths can be set by a user to produce various degrees of reverberation. Additionally, the user may control the perceived degree of reverberation by adding a controlled amount of the original, undelayed, signal to the reverberated signal.

Reverberation may be added in real time, as the signal is received at the personal computer, or off line, in a waveform editing application, for example.

BRIEF DESCRIPTION OF THE DRAWINGS

The above and further advantages of the invention may be better understood by referring to the following description in conjunction with the accompanying drawings, in which.

DETAILED DESCRIPTION OF ILLUSTRATIVE EMBODIMENTS

Figure 1:
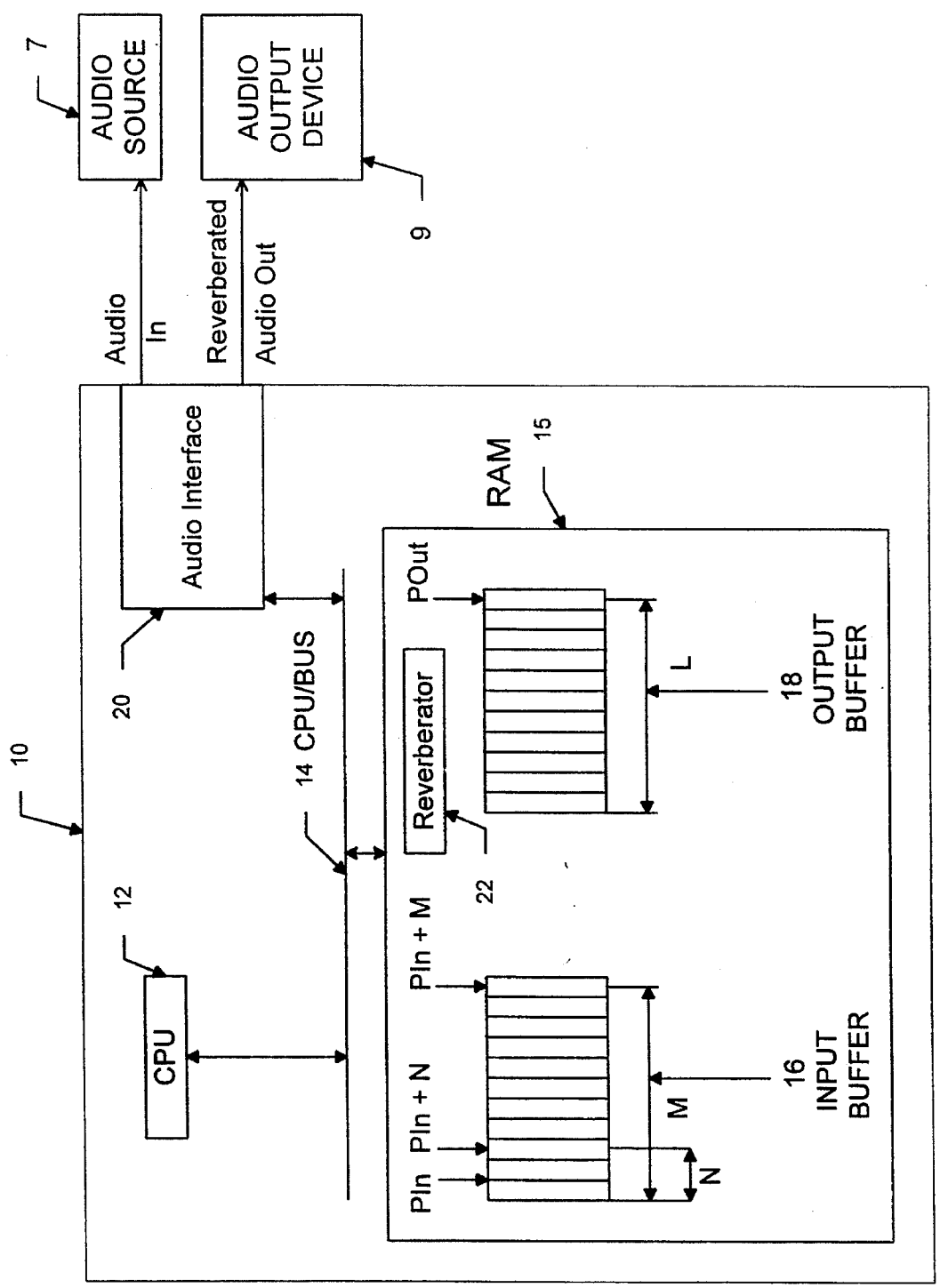
FIG. 1 is a block diagram of a personal computer employing the invention.

The personal computer system 10 of FIG. 1 is an illustrative embodiment of the inventive reverberation system. As is well known in the art, the computer 10 may be interfaced to, and interact with, a variety of devices such as CD-ROM drives, local area networks, MIDI instruments and audio equipment: any such devices which can function as an audio source 7 or audio output device 9. The computer 10 comprises a central processing unit (CPU) 12; a CPU bus 14; a RAM 15 which contains, inter alia, an input buffer 16 and an output buffer 18; an audio interface 20; and a reverberator program 22 located in the RAM 15. In the illustrative embodiment CPU 12 is preferably implemented with a microprocessor such as a 20 MHz 80386 microprocessor sold by the Intel Corporation of Santa Clara, Calif. or an equivalent thereof. Although other elements such as ROM, disk drives, etc. are essential for the operation of the computer 10, they are well known in the art, peripheral to the operation of the invention and, therefore not shown in FIG. 1.

In operation, audio signals are received by the audio interface 20 and converted to digital samples which are placed by the CPU 12, under direction of the reverberator 22, in the input buffer 16. Alternatively, the audio signals may already be in digital form, and, thus, digitization at this point will be unnecessary. Each sample of the input signal, delayed (i.e., previous) samples of the input signal contained within the input buffer 16, and a delayed output sample from the output buffer 18 are combined to produce a new output sample which is sent to the output buffer 18 and to the audio interface 20. The output samples, when converted to analog form in sequence at the system sampling rate (44,100 samples/sec. for this embodiment), are a reverberated version of the input audio signal.

The conversion from digital audio output samples to an analog audio output signal may take place in the audio interface 20 or at some remote location. Further, the conversion may take place in real time, for immediate reproduction, or it may take place after some period of storage. The conversion of signals from digital to analog form is well known in the art and neither the particular method of conversion nor the time at which conversion takes place is restricted by the invention.

The RAM locations used for the output buffer 18 and input buffer 16 are, in this embodiment, set aside by the CPU 12 under control of the reverberator 22 expressly for the purpose of storing the audio samples. As is explained in greater detail below, the buffers are "circular" buffers. They require as many locations as the greatest number of delays desired. Locations within the buffers are accessible through pointers PIn, PIn+N, PIn+M, and POut.

Figure 2:
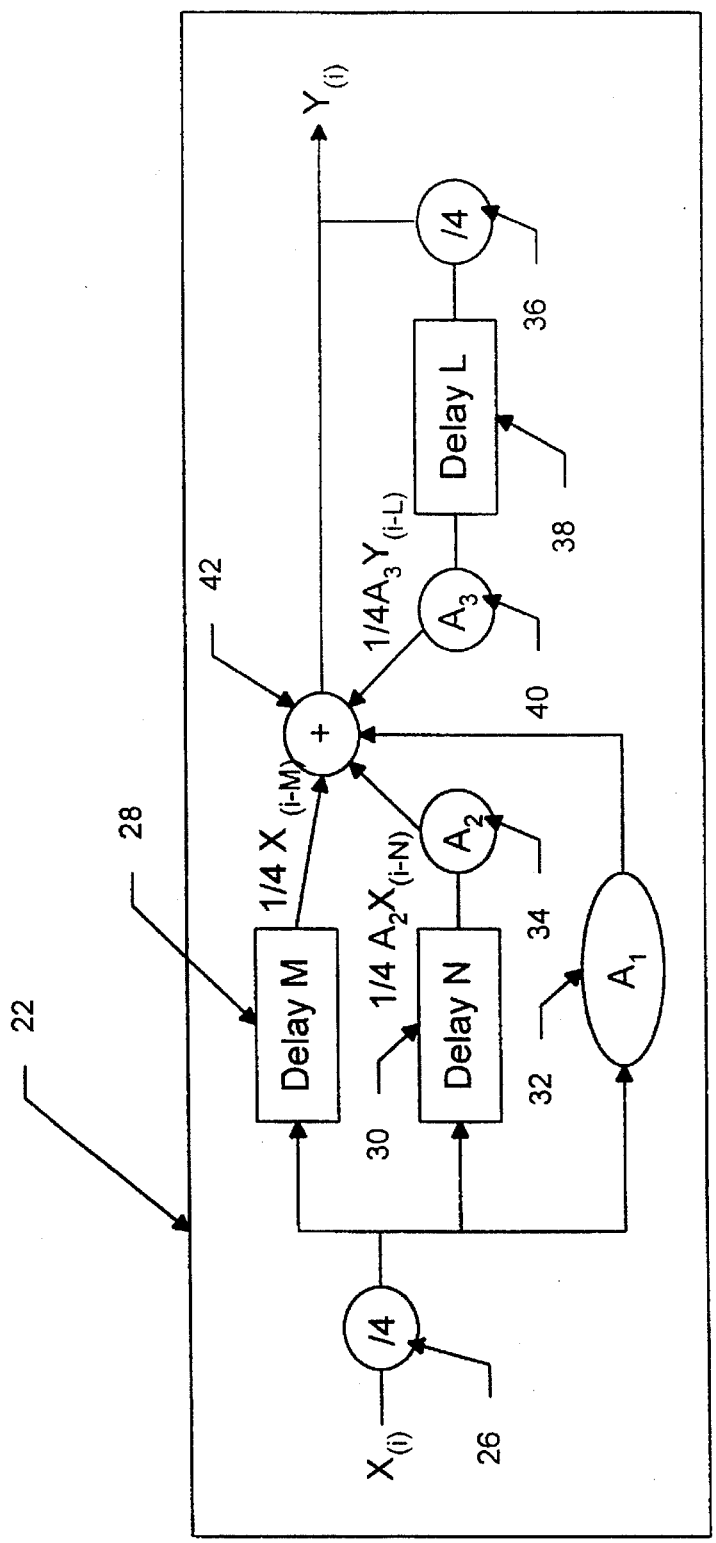
FIG. 2 is a block diagram of one embodiment of the invention.

FIG. 2 is a detailed illustration of the delay, multiplication and addition operations which form a part of the reverberator 22's operation. In operation the value of each audio input sample $X_{(i)}$ is preferably divided by 4 in the divider block 26. This division is optional and is performed to prevent overflow and resulting truncation of the audio sample which might otherwise occur in subsequent operations. After division in block 26, each sample $X_{(i)}$ is supplied to a delay block 28 which applies a delay of M sample intervals to each of its inputs and to a delay block 30 which applies a delay of N sample intervals to each of its inputs. The output of the delay block 28 is thus the previous sample $X_{(i-M)}$ and the output of the delay block 30 is thus the previous sample $X_{(i-N)}$. The input sample $X_{(i)}$ is also inverted and multiplied by a coefficient $A_1$ in multiplier block 32. It should be noted here, that, in the context of this disclosure, to invert a sample means to change the sign of the sample. Thus, the inverted version of a sample having the value 250 would have the value −250. Similarly, the output of delay block 30 is multiplied by the coefficient $A_2$ in multiplier block 34. An output sample, obtained from the output buffer 18 of FIG. 1, is, optionally, divided by 4 in divider block 36 and delayed by "L" sample intervals in delay block 38 to yield $Y_{(i-L)}$, and multiplied by the coefficient $A_3$ in multiplier block 40. The delayed, inverted and multiplied samples are summed in the block 42 to produce a reverberator output sample value $Y_{(i)}$. As discussed in greater detail below, the values for "L", "M", "N", $A_1$, $A_2$, and $A_3$ may be user-selectable and are generally in the range of 30–60 milliseconds.

More specifically, with reference to FIG. 1, each input sample is stored in a location in buffer 16 identified by a pointer PIn. The address for storage of each succeeding input sample is obtained by decrementing the pointer PIn by one. Pointers PIn+M and PIn+N thus designate locations containing samples recorded M and N sample intervals, respectively, prior to the sample identified by PIn. These latter pointers thus provide the delays indicated by blocks 28 and 30 in FIG. 2. Similarly, each output sample is stored in a location within buffer 18 identified by the pointer POut and the address of each succeeding output sample is obtained by decrementing the pointer POut by one. Because the buffer 18 has L locations, in the exemplary embodiment, the pointer POut designates a location containing, before a new output sample is computed, a sample recorded L intervals prior to the new output, which will be placed there after it is computed.

Multiplier block 32, simulates absorption of the non-reflected audio signal. In an acoustic environment, such as a concert hall, this absorption may be caused by acoustically absorptive materials, such as the seats, draperies, etc. and it is an important component of the characteristic sound of a given environment. Experiment has demonstrated that the inversion of this sample yields a fuller sound and the inverted sample is thus an important component of the reverberated signal produced by the invention. The delayed samples from blocks 30 and 28 will be perceived by a listener as echoes of the input signal $X_{(i)}$. The delayed output from block 40 will, because it is a delayed version of sound which has previously been "reverberated", be perceived as even more echo-like, as though it has been reflected back to the listener's ear after previously having impinged upon it.

Control of the variables M, N, L, $A_1$, $A_2$ and $A_3$ may be imparted through well-known interface techniques, such as a graphical user interface which provides graphical controls such as a "graphical potentiometer" in a pull-down menu. By adjusting these variables a user may exercise precise control over the echo and reverberation characteristics of sound reproduced by the system. Alternatively, combinations of these variables which simulate various listening environments may be preset and selected by a listener from a menu, the entries of which include "concert hall", "jazz club" etc., the menu thus providing indirect control of the reverberation characteristics through pre-set combinations of these variables.

Figure 3:
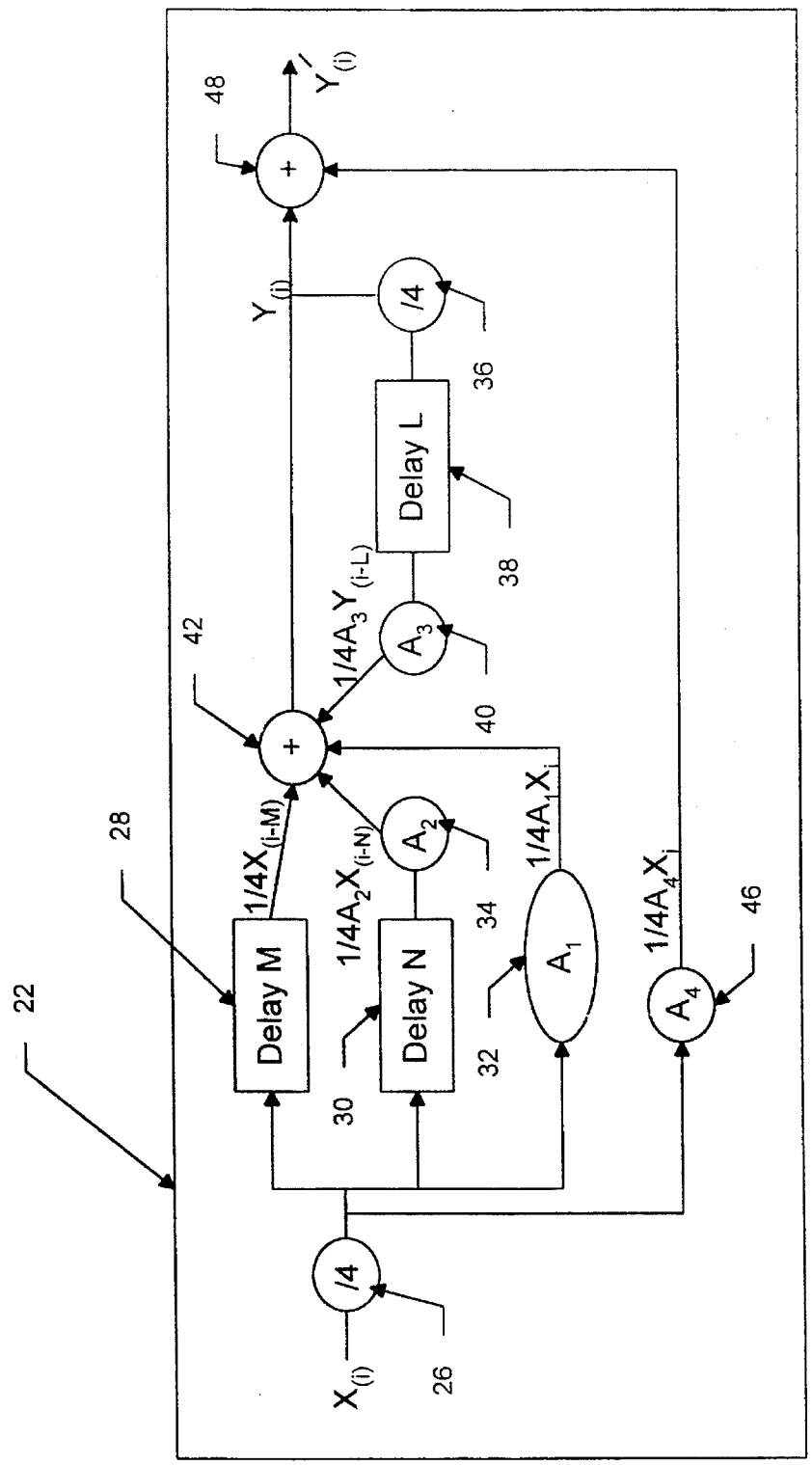
FIG. 3 is a block diagram of another embodiment of the invention.

FIG. 3 is an illustration of the delay, multiplication, and inversion operations executed by another embodiment of the invention. In this embodiment the divided input sample exiting block 26 is, in addition to the operations just described in conjunction with FIG. 2, multiplied by the coefficient $A_4$ in block 46. The resultant is added, at block 48, to $Y_{(i)}$, the reverberator output sample, to produce the output $Y'_{(i)}$. Preferences as to the level of reverberation vary from one listener to another and for the same listener, from one time to another. By adjusting the value of the coefficient $A_4$ in block 46, one may control the level of undelayed sound output by the system, thus producing greater or lesser degrees of reverberation, as desired.

Figure 4A:
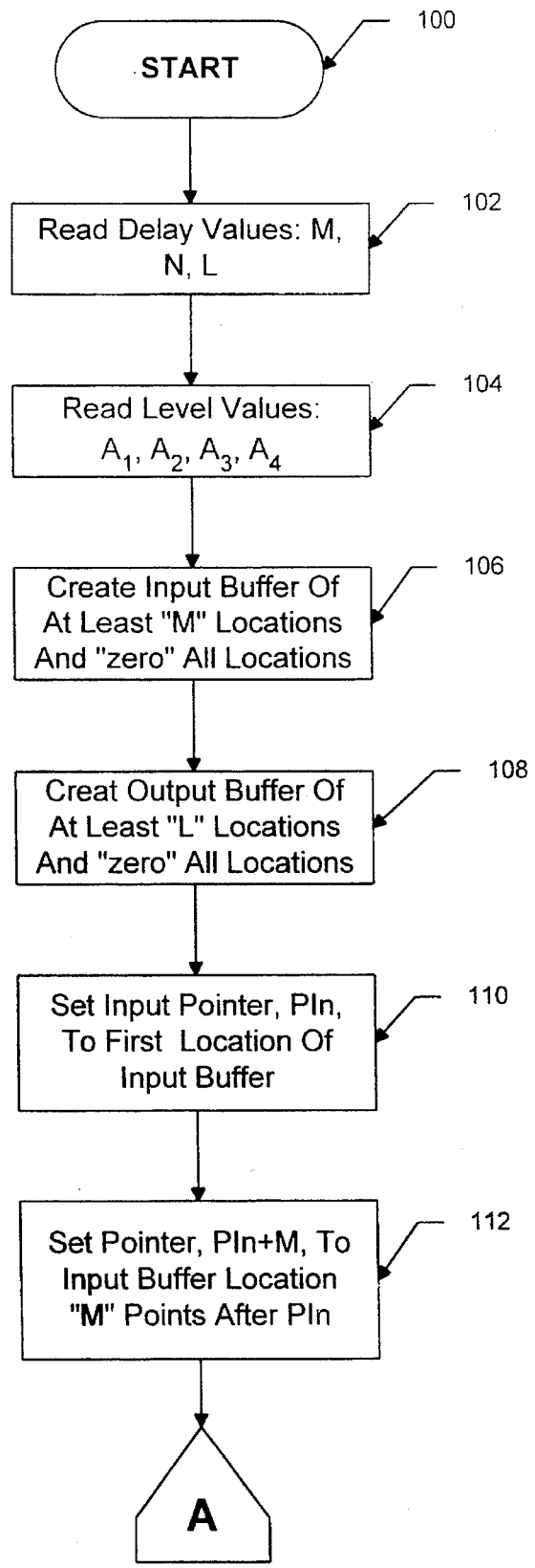
FIG. 4 form a flow chart of the reverberation process employed by the invention.
Figure 4B:
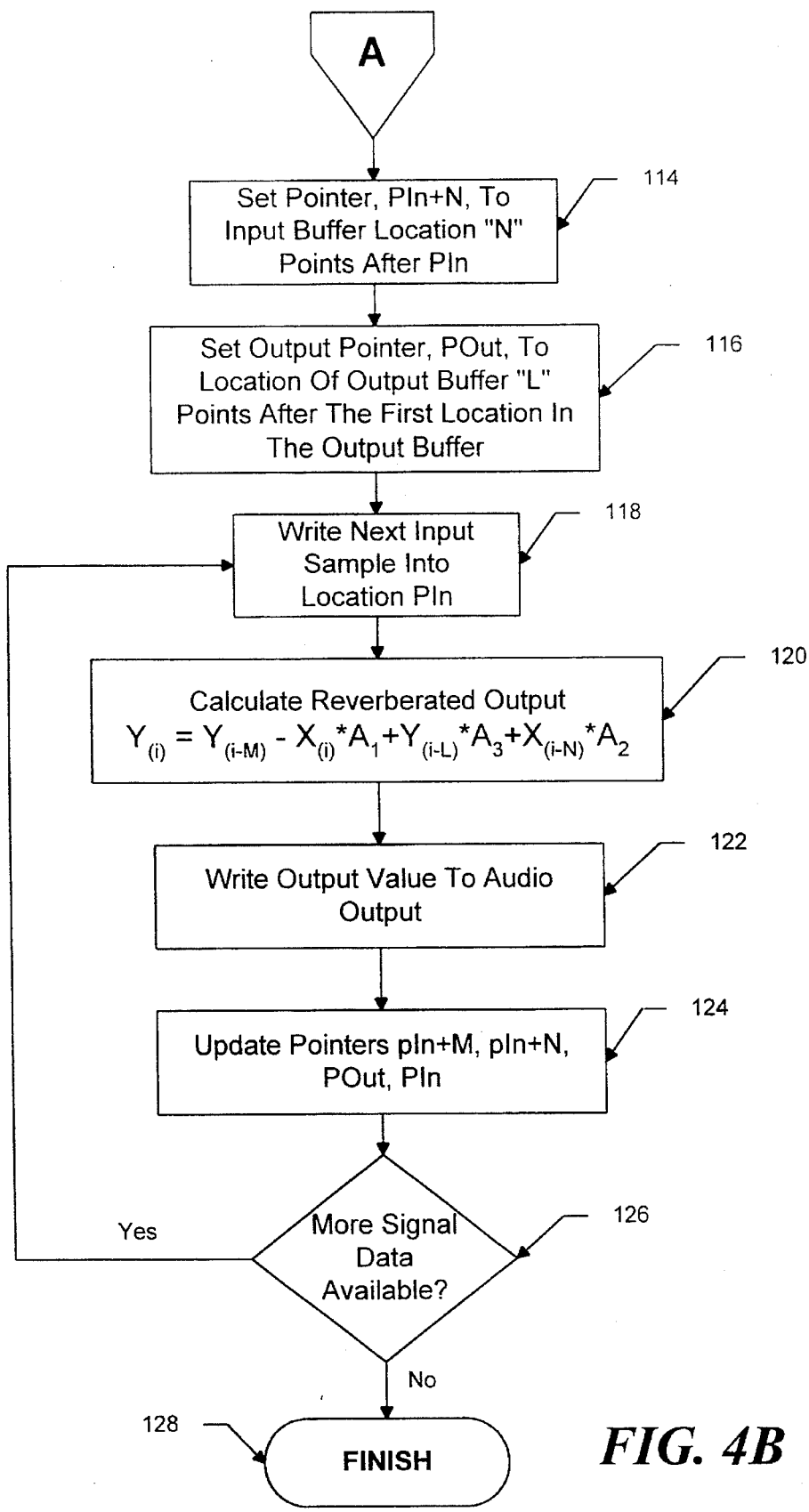

The flowchart of FIGS. 4A and 4B illustrates the sequential operation of the reverberator 22. Operation begins at 100 and proceeds to step 102 where the delay variables "M", "N", and "L" are read by the CPU 12. Next, in step 104, the level coefficients $A_1$ through $A_4$ are similarly read by the CPU 12. As previously discussed, the delay and level values can be user-selectable, either through direct manipulation of these values or through indirect manipulation by selection of preset characteristics such as "concert hall", or "jazz club".

The reverberator 22 proceeds to step 106, where it creates an input buffer 16 of at least "M" locations and clears all those locations. Next, the reverberator 22 proceeds to step 108 where it creates an output buffer 18 of at least "L" locations and clears all those locations. The input and output buffers can be composed of contiguous RAM locations set aside expressly for the purpose of holding input and output sample values. Further, the buffers 16 and 18 are preferably organized, as discussed above, as "circular" buffers whereby, as a pointer to locations within the buffer is decremented past the location with the lowest address, the pointer rolls over to the highest address of the buffer.

The reverberator 22 then proceeds to step 110, where it sets the input pointer PIn to the first location within the input buffer 16, (FIG. 1) then, in step 112 sets the delay pointer PIn+M to the input buffer location "PIn+M" and then to step 114 where it sets the pointer "PIn+N" to the input buffer location "PIn+N". In step 116 the reverberator 22 sets the output pointer to a location in the output buffer.

In step 118 the reverberator 22 stores the next available input sample (in this case the first input sample) in the input buffer location identified by PIn. In step 120 the reverberator 22 calculates the reverberator output signal sample and places the value in the location identified by POut. The output sample value, $Y_{(i)}$, is then computed according to the following equation, which reflects the block diagram of FIG. 2:

$$Y_{(i)} = X_{(i-M)} - X_{(i)} * A_1 + Y_{(i-L)} * A_3 + X_{(i-N)} * A_2$$

In addition to sending the output sample value to the output buffer location "Pout", the reverberator 22 may send the output sample value to the audio interface 20 and/or to a storage device such as a disk drive, magnetic tape, etc., not shown.

In step 124 the reverberator 22 decrements all the pointers. As noted above, if the buffers 16 and 18 are organized as circular buffers, the pointers may be decremented at this point and, if a pointer value is less than the lowest buffer address, the pointer will be set equal to the highest address value of the buffer.

In step 126 the reverberator 22 determines whether there are more input samples. If there are more input samples, the reverberator 22 returns to step 118 where it stores the next input sample in the location identified by the (updated) input pointer PIn and proceeds as previously described. If there are no more input samples, the reverberator 22, after employing the remaining buffer contents to produce the final reverberated outputs, proceeds to step 128, Finish.

The foregoing description has been limited to a specific embodiment of this invention. It will be apparent, however, that variations and modifications may be made to the invention, with the attainment of some or all of its advantages. For example, although the illustrative embodiment is implemented in software, the principles of the invention can also be achieved by using discrete or integrated elements in a hardware circuit. Therefore, it is the object of the appended claims to cover all such variations and modifications as come within the true spirit and scope of the invention.

What is claimed is:

1. An audio signal processor for generating a reverberated digital word stream at an output from a sequential stream of input digital words, each of the input digital words comprising a digitized audio sample, the audio processor comprising:

a first first-in, first-out buffer having an input for receiving the input digital words, a first number of stages, wherein each stage stores one of the digital words, a first timing mechanism for clocking the input digital words through the first first-in, first-out buffer at a constant rate and an output for producing first delayed words corresponding to audio samples delayed by a time interval taken for the input digital words to pass through the first number of stages;

a second first-in, first-out buffer having an input for receiving the input digital words, a second number of stages, wherein each stage stores one of the digital words, a second timing mechanism for clocking the input digital words through the second first-in, first-out buffer at a constant rate and an output for producing second delayed words corresponding to audio samples delayed by a time interval taken for the input digital words to pass through the second number of stages;

a first digital multiplier responsive to the input digital words for multiplying the input digital words by a first adjustable coefficient;

a second digital multiplier connected to the second first-in, first-out buffer for multiplying the second delayed words by a second adjustable coefficient;

a first digital adder responsive to the input digital words, the first delayed words, the second delayed words and feedback words for generating first sum output words;

a third first-in, first-out buffer having an input for receiving the first sum output words, a third number of stages, wherein each stage stores one of the first sum output words, a third timing mechanism for clocking the first sum output words through the third first-in, first-out buffer at a constant rate and an output for producing intermediate words corresponding to the first sum output words delayed by a time interval taken for the first sum output words to pass through the third number of stages;

a third digital multiplier responsive to the intermediate words for multiplying the intermediate words by a third adjustable coefficient to produce the feedback words; and output apparatus for transmitting the first sum output words to the output as the reverberated digital word stream.

2. The audio signal processor of claim 1 further comprising first user-operated means for adjusting the first number of stages, the second number of stages and the third number of stages.

3. The audio signal processor of claim 2 wherein the first user-operated means comprises a start pointer indicating the beginning of the first first-in, first-out buffer, an end pointer indicating the end of the first first-in, first-out buffer and a third user-operated means for adjusting the end pointer relative to the start pointer.

4. The audio signal processor of claim 1 further comprising second user-operated means for adjusting values of the first adjustable coefficient, the second adjustable coefficient and the third adjustable coefficient.

5. The audio signal processor of claim 1 further comprising a second digital adder responsive to the first sum output words and to the input digital words for producing second sum output words and wherein the transmitting apparatus transmits the second sum output words to the output as the reverberated digital word stream.

6. A computer system comprising:

a central processing unit for coordinating the operation of the computer;

a memory having a plurality of memory locations for storing data and programs for controlling the central processing unit;

a clock for generating timing signals;

an audio signal source responsive to an analog audio signal for generating a sequential stream of input digital words, each of the input digital words comprising a digitized audio sample;

a first first-in, first-out buffer having an input for receiving the input digital words, a first number of stages, wherein each stage stores one of the digital words, a first timing mechanism responsive to the timing signals for clocking the input digital words through the first first-in, first-out buffer at a constant rate and an output for producing first delayed words corresponding to audio samples delayed by a time interval taken for the input digital words to pass through the first number of stages;

a second first-in, first-out buffer having an input for receiving the input digital words, a second number of stages, wherein each stage stores one of the digital words, a second timing mechanism responsive to the timing signals for clocking the input digital words through the second first-in, first-out buffer at a constant rate and an output for producing second delayed words corresponding to audio samples delayed by a time interval taken for the input digital words to pass through the second number of stages;

a first digital multiplier responsive to the input digital words for multiplying the input digital words by a first adjustable coefficient;

a second digital multiplier connected to the second first-in, first-out buffer for multiplying the second delayed words by a second adjustable coefficient;

a first digital adder responsive to the input digital words, the first delayed words, the second delayed words and feedback words for generating first sum output words;

a third first-in, first-out buffer having an input for receiving the first sum output words, a third number of stages, wherein each stage stores one of the first sum output words, a third timing mechanism responsive to the timing signals for clocking the first sum output words through the third first-in, first-out buffer at a constant rate and an output for producing intermediate words corresponding to the first sum output words delayed by a time interval taken for the first sum output words to pass through the third number of stages;

a third digital multiplier responsive to the intermediate words for multiplying the intermediate words by a third adjustable coefficient to produce the feedback words; and output apparatus for transmitting the first sum output words to the output as a reverberated digital word stream.

7. The computer system of claim 6 further comprising first user-operated means for adjusting the first number of stages, the second number of stages and the third number of stages.

8. The computer system of claim 7 wherein the first user-operated means comprises a start pointer indicating the beginning of the first first-in, first-out buffer, an end pointer indicating the end of the first first-in, first-out buffer and a third user-operated means for adjusting the end pointer relative to the start pointer.

9. The computer system of claim 8 further comprising second user-operated means for adjusting values of the first adjustable coefficient, the second adjustable coefficient and the third adjustable coefficient.

10. The computer system of claim 9 further comprising a second digital adder responsive to the first sum output words and to the input digital words for producing second sum output words and wherein the transmitting apparatus transmits the second sum output words to the output as the reverberated digital word stream.

11. A method for generating a reverberated digital word stream at an output from a stream of input digital words, each of the input digital words comprising a digitized audio sample, the method comprising the steps of:

A. delaying the input digital words by a first time interval to produce first delayed words corresponding to audio samples delayed by a first time interval;

B. delaying the input digital words for a second time interval to produce second delayed words corresponding to audio samples delayed by a second time interval;

C. adding the input digital words, the first delayed words, the second delayed words and feedback words for generating first sum output words;

D. delaying the first sum output words for producing the feedback words or responding to the first sum output words delayed by a third time interval; and E. transmitting the first sum output words to the output as the reverberated digital word stream.

12. The method of claim 11 further comprising the step of:

F. adjusting the first time interval, the second time interval and the third time interval in response to user inputs.

13. The method claim 11 further comprising the steps of:

G. multiplying the input digital words by a first adjustable coefficient prior to the addition of step C;

H. multiplying the second delayed words by a second adjustable coefficient prior to the addition of step C; and I. multiplying the feedback words by a third adjustable coefficient prior to the addition of step C.

14. The method of claim 13 further comprising the steps of:

J. adjusting values of the first adjustable coefficient, the second adjustable coefficient and the third adjustable coefficient in response to user inputs.

15. The method of claim 11 further comprising the steps of:

K. adding the first sum output words to the input digital words to producing second sum output words; and L. transmitting the second sum output words to the output as the reverberated digital word stream.

16. A computer program product for use with a graphics display device, said computer program product comprising:

a computer usable medium having computer readable program code means embodied in said medium for generating a reverberated output digital word stream at an output from an input digital word stream, each of the input digital words comprising a digitized audio sample, the computer program product comprising:

a means for delaying the input digital words by a first time interval to produce first delayed words corresponding to audio samples delayed by the first time interval;

a means for delaying the input digital words by a second time interval to produce second delayed words corresponding to audio samples delayed by the second time interval;

a means for adding the input digital words, the first delayed words, the second delayed words and feedback words to generate first sum output words;

a means for delaying the first sum output words by a third time interval to produce the feedback words corresponding to the first sum output words delayed by the third time interval; and a means for causing a computer to transmit the first sum output words to the output as the reverberated digital word stream.

17. The computer program product as defined in claim 16 further comprising:

a first means for multiplying the input digital words by a first adjustable coefficient;

a second means for multiplying the second delayed words by a second adjustable coefficient; and a third means for multiplying the feedback words by a third adjustable coefficient.

18. A computer program product comprising:

a computer usable medium having computer readable program code means embodied in said medium for generating a reverberated output digital word stream at an output from an input digital word stream, each of the input digital words comprising a digitized audio sample, the computer program product comprising:

a means for delaying the input digital words by a first time interval to produce first delayed words corresponding to audio samples delayed by the first time interval;

a means for delaying the input digital words by a second time interval to produce second delayed words corresponding to audio samples delayed by the second time interval;

a means for adding the input digital words, the first delayed words, the second delayed words and feedback words to generate first sum output words;

a means for delaying the first sum output words by a third time interval to produce the feedback words corresponding to the first sum output words delayed by the third time interval; and a means for causing a computer to transmit the first sum output words to the output as the reverberated digital word stream.

19. The computer program product according to claim 18 further comprising:

a first means for multiplying the input digital words by a first adjustable coefficient;

a second means for multiplying the second delayed words by a second adjustable coefficient; and a third means for multiplying the feedback words by a third adjustable coefficient.

20. The computer program product according to claim 19 further comprising:

a means for adjusting, responsive to user inputs, the first time interval, the second time interval, and the third time interval.

* * * * *